United States Patent
Otremba et al.

(10) Patent No.: US 9,368,435 B2
(45) Date of Patent: Jun. 14, 2016

(54) ELECTRONIC COMPONENT

(71) Applicant: Infineon Technologies AG, Neubiberg (DE)

(72) Inventors: Ralf Otremba, Kaufbeuren (DE); Klaus Schiess, Allensbach (DE); Dominic Maier, Pleystein (DE); Chooi Mei Chong, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/493,493

(22) Filed: Sep. 23, 2014

(65) Prior Publication Data
US 2016/0086876 A1    Mar. 24, 2016

(51) Int. Cl.
*H01L 23/495* (2006.01)
*H01L 23/31* (2006.01)
(Continued)

(52) U.S. Cl.
CPC ...... *H01L 23/49562* (2013.01); *H01L 23/3107* (2013.01); *H01L 23/481* (2013.01);
(Continued)

(58) Field of Classification Search
CPC ....... H01L 23/528; H01L 27/00; H01L 24/03; H01L 23/58; H01L 23/3107; H01L 23/481; H01L 23/49575; H01L 23/49562; H01L 24/17; H01L 24/19; H01L 24/82; H01L 25/072; H01L 2224/0612; H01L 2224/0237; H01L 2224/16245; H01L 2224/1712; H01L 2924/1304; H01K 1/181
USPC ........ 361/91.1–91.8; 438/106, 109, 120, 121, 438/122, 123, FOR. 368, FOR. 426; 257/107, 173, 629, 686, 697, 723, 737, 257/738, 777, 778, 780, 784, E21.502, 257/E23.021, E23.023, E23.069, E23.085, 257/E25.03, E25.006, E25.013, E25.021, 257/E25.027

See application file for complete search history.

(56) References Cited

U.S. PATENT DOCUMENTS

| 5,496,775 | A | 3/1996 | Brooks |
| 5,923,954 | A | 7/1999 | Cho |

(Continued)

FOREIGN PATENT DOCUMENTS

| DE | 102007017831 A1 | 10/2008 |
| WO | 03015165 A2 | 2/2003 |

OTHER PUBLICATIONS

Boettcher, et al., "Embedding of Chips for System in Package Realization—Technology and Applications", Microsystems, Packaging, Assembly & Circuits Technology Conference, 2008. IMPACT 2008. 3rd International, Oct. 22-24, 2008, Institute of Electrical and Electronics Engineers, pp. 1-7.

*Primary Examiner* — Armando Rodriguez
(74) *Attorney, Agent, or Firm* — Murphy, Bilak & Homiller, PLLC

(57) ABSTRACT

In an embodiment, an electronic component includes a dielectric layer, a semiconductor device embedded in the dielectric layer, an electrically conductive substrate, a redistribution layer having a first surface and a second surface providing at least one outer contact, and a first electrically conductive member. The semiconductor device has a first surface including at least one first contact pad and a second surface including at least one second contact pad. The second contact pad is mounted on the electrically conductive substrate. The first electrically conductive member includes at least one stud bump and extends between the electrically conductive substrate and the first surface of the redistribution layer.

26 Claims, 5 Drawing Sheets

(51) Int. Cl.
*H01L 23/00* (2006.01)
*H01L 23/48* (2006.01)
*H01L 25/07* (2006.01)

(52) U.S. Cl.
CPC .......... *H01L23/49575* (2013.01); *H01L 24/17* (2013.01); *H01L 25/072* (2013.01); *H01L 2224/0237* (2013.01); *H01L 2224/16245* (2013.01); *H01L 2224/1712* (2013.01); *H01L 2924/1304* (2013.01)

(56) References Cited

U.S. PATENT DOCUMENTS 7,759,777 B2   7/2010  Otremba et al.
8,030,131 B2 * 10/2011  Otremba ............. H01L 23/5389
                                                      257/E21.499
2002/0171155 A1  11/2002  Fujihira \* cited by examiner

ELECTRONIC COMPONENT

BACKGROUND

An electronic component may include one or more semiconductor devices in a package. The package includes internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections.

SUMMARY

In an embodiment, an electronic component includes a dielectric layer, a semiconductor device embedded in the dielectric layer, an electrically conductive substrate, a redistribution layer having a first surface and a second surface which provides at least one outer contact, and a first electrically conductive member. The semiconductor device has a first surface including at least one first contact pad and a second surface including at least one second contact pad. The second contact pad is mounted on the electrically conductive substrate. The first electrically conductive member includes at least one stud bump and extends between the electrically conductive substrate and the first surface of the redistribution layer.

In an embodiment, an electronic component includes a dielectric layer, a semiconductor device embedded in the dielectric layer, a redistribution layer having a first surface and a second surface which provides at least one outer contact, an electrically conductive substrate, and a first electrically conductive member extending between the electrically conductive substrate and the first surface of the redistribution layer. The semiconductor device has a first surface including at least one first contact pad and a second surface including a second contact pad. The second contact pad is mounted on the electrically conductive substrate. At least one stud bump extends between the first contact pad and the first surface of the redistribution layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
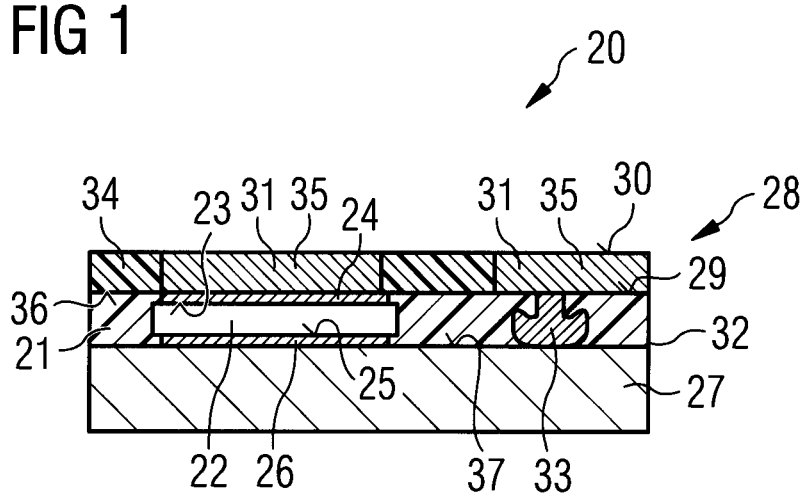
FIG. 1 illustrates an electronic component according to a first embodiment.

In the following detailed description, reference is made to the accompanying drawings, which form a part hereof, and in which is shown by way of illustration specific embodiments in which the invention may be practiced. In this regard, directional terminology, such as "top", "bottom", "upper", "lower", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

FIG. 1 illustrates an electronic component 20 according to a first embodiment. The electronic component 20 includes a dielectric layer 21 and a semiconductor device 22 which is embedded in the dielectric layer 21. The semiconductor device 22 includes a first surface 23 including a first contact pad 24 and a second surface 25 including a second contact pad 26. In some embodiments, the first surface includes two or more contact pads.

The electronic component 20 further includes an electrically conductive substrate 27 and redistribution layer 28 including a first surface 29 and a second surface 30. The second surface 30 provides at least one outer contact 31 for the electronic component 20. The electronic component 20 further includes a first electrically conductive member 32. The second contact pad 26 of the semiconductor device 22 is mounted on the electrically conductive substrate 27 and the first electrically conductive member 30 extends between the electrically conductive substrate 27 and the first surface 29 of the redistribution layer 28. The first electrically conductive member 32 includes at least one stud bump 33.

The stud bump 33 is mechanically attached and electrically coupled to the substrate 27 and electrically couples the second contact pad 26 of the semiconductor device 22 to the redistribution layer 28. The stud bump 33 includes a metal or an alloy which has a melting point above 500° C. The stud bump 33 is, therefore, free of soft solder. The stud bump 33 may be formed by use of a bond wire machine which may also be used to form bond wire connections between a semiconductor device and a substrate such as a leadframe.

The stud bump 33 may be formed from a metal wire, such as a copper bond wire, an aluminium bond wire or a gold bond wire. The bonding machine may be used to melt the end of the wire, forming a ball which is pressed onto the substrate 27 to form a bond head which is attached to the substrate 27. The bond wire may be cut just above the bond head to form the stud bump 33. The stud bump 33 includes a microstructure characteristic of recrystallised metal. In the case of the use of a bond wire machine using a thermocompression wire bonding technique, the bond head also has a recrystallized microstructure which is characteristic of mechanical deformation.

The electrically conductive substrate 27, the dielectric layer 21 and the redistribution structure 27 are substantially coplanar and arranged substantially parallel to one another. In the electronic component according to the first embodiment, the semiconductor device 22 extends between the substrate 27 and the first surface 29 of the redistribution layer 28. The first contact pad 24 is in direct contact with an electrically conductive portion 35 of the redistribution layer 28.

The first electrically conductive member 32 has a height which is substantially similar to the height of the semiconductor device 22 and, therefore, bridges the gap between the planar substrate 27 and the planar redistribution layer 28. The first electrically conductive member 32 provides a portion of an electrically conductive redistribution structure from the second contact pad 26 mounted on the substrate 27 to the redistribution layer 28 which is arranged on adjacent the opposing surface of the semiconductor device 22.

The redistribution layer 28 includes substantially planar electrically conductive portions 35 and may further include a dielectric layer 34 which is arranged between the electrically conductive portions of the redistribution layer 28.

The dielectric layer 21, in which the semiconductor device 22 is embedded, may include an epoxy resin including filler particles such as silicon dioxide filler particles or a resin-coated copper foil. The dielectric layer 21 is applied after the semiconductor device 22 and the stud bump 33 are attached to the electrically conductive substrate 25. The redistribution layer 28 may be provided by a laminated material including a glassfibre reinforced epoxy resin for the dielectric layer 34 and a metal or metal foil for electrically conductive portions 35. The redistribution layer 28 may be applied as a semi-finished part, for example in a B-stage form onto the upper surface 34 of the dielectric layer 21 or may be built up layer by layer on the upper surface 34 of the dielectric layer 21.

The maximum lateral extent of the stud bump 33 may be approximately twice that of the diameter of the bond wire from which the stud bump 33 is made. For example, if a bond wire of 20 μm is used, the maximum lateral extent of the stud bump is around 40 μm. If the bond wire has a diameter of around 50 μm, maximum lateral width of the stud bump is around 100 μm.

The outer contour of the stud bump 33 is varies in its lateral extent and typically has a substantially bulbous outer contour. Typically, the contact area between the lower portion of the stud bump 33 and the underlying surface 37 is slightly smaller than the maximum lateral extent of the central portion of the stud bump 33. The area of the stud bump 33 which is in contact with the overlying portion of the redistribution layer 28 may also have a lateral extent which is less than the maximum lateral extent of the stud bump 33. In some embodiments, after the stud bump 33 is formed, a grinding process is carried out, for example after the stud bump 33 is embedded in the dielectric layer 21, whereby a portion of the neck of the stud bump 33 is removed such that the remaining portion of the stud bump 33 has a generally oval cross-section.

The substrate 27 may be provided by a portion of a lead frame including a metal or an alloy. The surface of the substrate 27 may be prepared to facilitate a good connection to the semiconductor device 22 and/or the stud bump 33. For example, the at least the die attach area on which the semiconductor device is mounted may include a solder wettable material and the area on which the stud bump is formed may include a wire bondable material. The substrate 27 may also include an electrically conductive layer arranged on an electrically insulating layer such as a laminate board, or a ceramic substrate. The semiconductor device 22 may be arranged on, and electrically coupled to, the electrically conductive portion of the substrate.

The electronic component 20 may be mounted on a higher level rewiring board, such as a printed circuit board, by means of the outer contacts 31 is provided by the redistribution layer 28. In the mounted position, the substrate 27 faces away from, for example upwardly, from the higher level rewiring board.

In some embodiments, the electrically conductive member 32, which extends between the substrate 27 and the first surface 29 of the redistribution layer 28, may include a plurality of stud bumps arranged in a stack. The stack includes an outer contour with a varying diameter due to the form of the individual stump bumps.

The electronic component 20 may be assembled by providing an electrically conductive substrate 27, mounting the second contact pad 26 of the semiconductor device 22 on the upper surface 37 of the substrate 27, forming a stud bump 33 on the upper surface 37 of the substrate 27 adjacent to the semiconductor device 22, embedding the side faces and any remaining portions of the first surface 23 and second surface 25 of the semiconductor device 22 and the first electrically conductive member 32 in a dielectric material 21, applying electrically conductive portions 35 and the dielectric layer 34 of the redistribution layer 28 onto the upper surface 36 the dielectric layer 21 to form an assembly. In particular, the electrically conductive potion 31 may be applied to the contact pad 24 and the electrically conductive portion 35 to the stud bump 33 to electrically couple the electrically conductive potion 31 may with the contact pad 24 and the electrically conductive portion 35 with the stud bump 33. The assembly may then be heat-treated and pressure applied to fully cure the dielectric layers 21, 33 and electrically couple the electrically conductive portions 35 of the redistribution layer 28 to the first contact pad 24 and first electrically conductive member 32.

The formation of the vertical portion of the redistribution structure from the second contact pad 26 to the redistribution layer 28 arranged on the opposing side of the semiconductor device 22 using a stud bump may be performed cost effectively as a stud bump can be formed for a large number of components in a short time frame.

Typically, the electronic component is not assembled individually, but a large number of component positions are provided on a support, for example a leadframe strip. A stud bump can be formed on a substrate of each of the component positions, a semiconductor device placed in the component positions and a single solder process carried out to attach the semiconductor devices to the substrate. The dielectric layer and redistribution layer may also be applied for all of the component positions in a single process.

Figure 2:
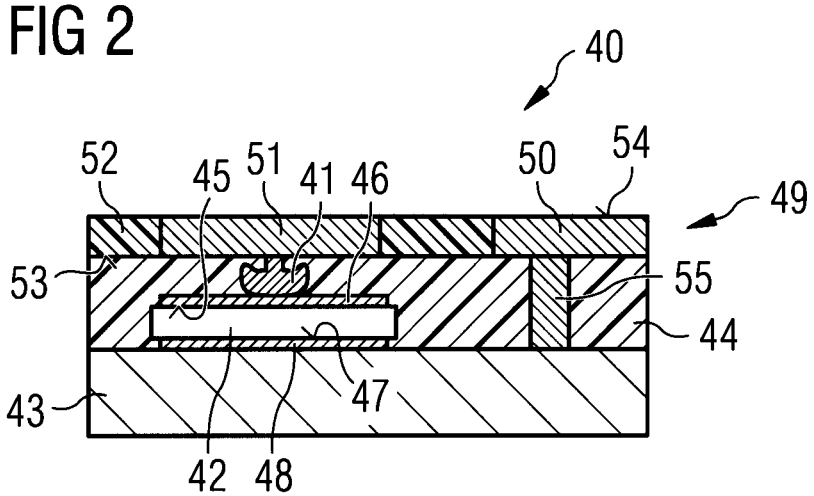
FIG. 2 illustrates the electronic component according to a second embodiment.

FIG. 2 illustrates an electronic component 40 according to a second embodiment. The electronic component 40 includes at least one stud bump 41. The stud bump 41 is, in the second embodiment, mounted on a semiconductor device 42 rather than on a substrate 43 of the electronic component 40 as in the first embodiment illustrated in FIG. 1.

The electronic component 40 includes a dielectric layer 44 and the semiconductor device 42 is embedded in the dielectric layer 44. The semiconductor device 42 includes a first surface 45 including a first contact pad 46 and a second surface 47 including a second contact pad 48. The second surface 47 opposes the first surface 45. The second contact pad 48 is mounted on the substrate 43 and the stud bump 41 is arranged on, and electrically coupled to, the first contact pad 46 of the semiconductor device 42. The stud bump 41 is in direct contact with the first contact pad 46 and an electrically conductive portion 50 of the redistribution layer 49 and electrically couples the first contact pad 46 to the redistribution layer 49. In some embodiments, the first surface 45 includes two or more contact pads. In these embodiments, at least one stud bump may be arranged on each contact pad.

The electronic component 40 according to the second embodiment includes a redistribution layer 49 including electrically conductive portions 50, 51 and electrically insulating portions 52 which surround the electrically conductive portions 50, 51. The stud bump 41 extends between the first contact pad 46 on the first surface 45 of the semiconductor device 42 and a first surface 53 of the redistribution layer 49 which faces towards the semiconductor device 42. The opposing outer surface 54 of the redistribution layer 49 provides outer contact surfaces for the electronic component 40.

The stud bump 41 may be used to space the first surface 53 of the redistribution layer 49 from the upper surface 45 of the semiconductor device 42.

The second contact pad 48 on the opposing side of the semiconductor device 42 may be electrically coupled to the redistribution layer 49 by a first electrically conductive member 55 which extends between the substrate 43 and the first surface 53 of the redistribution layer 49. The first electrically conductive member 55 is arranged adjacent and spaced apart from a side face of the semiconductor device 42.

In the second embodiment, the first conductive member 55 does not include a stud bump but may be provided by an electrically conductive pillar, for example a copper pillar, an electrically conductive via in which at least side walls of a through-hole in the dielectric layer 44 are coated with an electrically conductive material, a contact clip, an electrically conductive foil or a portion of the substrate 43 which is bent in a region adjacent to a side face of the semiconductor device 42 such that a portion of the first electronic electrically conductive member 55 is substantially coplanar with the upper surface of the stud bump 41 arranged on the first contact pad 46 of the semiconductor device 42.

The stud bump 41 may be used as part of a three-dimensional electrically conductive redistribution structure from the first contact pad 46 to the outer contact surfaces 54 of the electronic component 40. This enables the outer contact surfaces 54 of the electronic component 42 to have a different size and lateral arrangement, from the lateral arrangement and size of the contact pads of the semiconductor device 42. The lateral arrangement including the size of the outer contacts of an electronic component or a package, is commonly known as the footprint of the electronic component 40. Creating a distance between the electronic electrically conductive portions 50, 51 of the redistribution layer 49 and the semiconductor device 42 which is filled by portions of the dielectric layer 44 may also be used to improve the electrical insulation of the semiconductor device 42.

The electrically conductive member extending between the substrate and the first surface of the redistribution layer may include a conductive pillar and a stud bump arranged on the conductive pillar. The conductive pillar may be arranged on the substrate and the stud bump may be arranged between the conductive pillar and the first surface of the redistribution layer. This arrangement may be useful if a grinding process is used to smooth surface of the dielectric layer and the electrically conductive member. Since the uppermost portion of the stud bump has a smaller lateral area than the maximum lateral area of the stud bump and the pillar, contamination of the surface of the stud bump which interfaces with the redistribution layer may be reduced.

In addition to the first electrically conductive member extending between the substrate and the first surface of the redistribution layer which includes one or more stud bumps, the electronic component may further include at least one second electrically conductive member which extends between the first contact pad and the first surface of the redistribution layer and which includes a stud bump. For example, at least one stud bump may be arranged on the first contact pad and a stack of two or more stud bumps may be arranged on the substrate such that the first surface of the redistribution layer is substantially planar and spaced at a distance from both the first contact pad and from the substrate.

A plurality of stud bumps may be arranged on the first contact pad whereby each stud bump is a single stud bump which extends between the first contact pad and the first surface of the redistribution layer. This arrangement may be used for a large area contact pad such as a source contact pad or drain contact pad of a power transistor. The spacing between individual single stud bumps may be approximately double that of the lateral size of the stud bump. For example, for stud bumps having a lateral size of around 40 µm, the space between adjacent stud bumps may be around 80 µm.

Various arrangements of the dielectric layer with respect to the substrate may be used. In some embodiments, only the upper surface of the substrate is embedded in the dielectric layer. In some embodiments, side faces of the substrate may be embedded in the dielectric layer or may remain free of the dielectric layer. Similarly, the rear surface of the substrate may be exposed from the dielectric layer or may be embedded in the dielectric layer.

The redistribution layer may include a substantially planar sublayer which includes a substantially planar electrically conductive redistribution structure which is surrounded by a substantially planar dielectric layer. Further electrically conductive portions may be arranged on the substantially planar electrically conductive redistribution structure to provide slightly protruding outer contact surfaces.

In some embodiments, the redistribution layer includes at least two substantially planar sublayers. Each sublayer may include a substantially planar electrically conductive redistribution structure surrounded by a substantially planar dielectric layer. Adjacent sublayers may be electrically coupled by at least one conductive via extending between substantially planar electrically conductive portions of adjacent sublayers. This arrangement may be used to provide a multilayer redistribution structure in three dimensions within the redistribution layer.

The electronic component may include different types of semiconductor devices. In some embodiments, the semiconductor device includes a transistor device, such as a power transistor device having a vertical drift path. The power transistor device may include a MOSFET, an Insulated Gate Bipolar Transistor (IGBT) or a Bipolar Junction Transistor (BJT). For MOSFET devices, the first current electrode may be a source electrode, the control electrode may be a gate electrode and the second current electrode may be a drain electrode. For IGBT devices, the first current electrode may be an emitter electrode, the control electrode may be a gate electrode and the second current electrode may be a collector electrode. For BJT devices, the first current electrode may be an emitter electrode, the control electrode may be a base electrode and the second current electrode may be a collector electrode.

In some embodiments, the semiconductor device includes a third contact pad which is arranged on the first surface adjacent the first contact pad. The semiconductor device may be a vertical transistor device. A third electrically conductive member including a stud bump is provided that extends between the third contact pad and the first surface of the redistribution layer. The stud bump may include a height and lateral area which corresponds to the height and lateral area of the stud bumps arranged on the first contact pad.

In some embodiments, the electronic component includes at least one further semiconductor device. For example, the semiconductor device and the further semiconductor device may each include a transistor device. The transistor devices may be coupled in a half bridge configuration within the electronic component.

Figure 3:
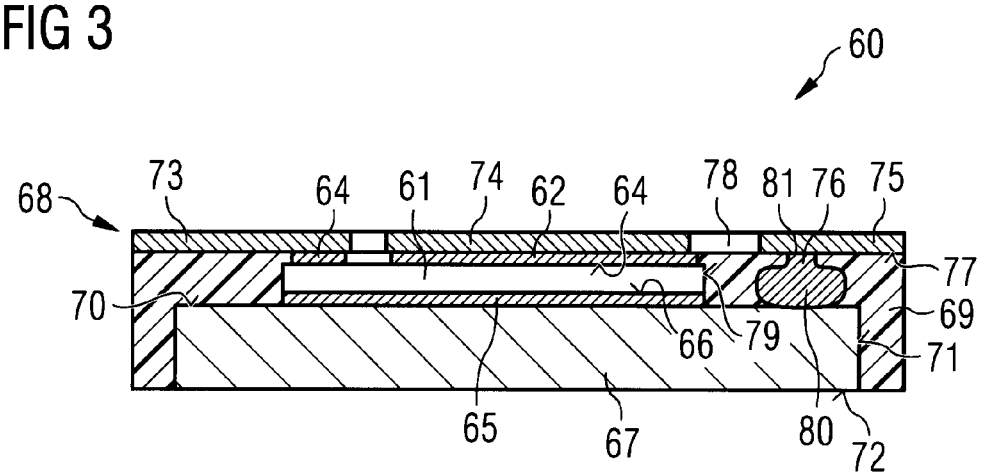
FIG. 3 illustrates an electronic component according to a third embodiment.

FIG. 3 illustrates an electronic component 60 according to a third embodiment. The electronic component 60 includes a semiconductor device in the form of a transistor device 61 which, in this embodiment, is a vertical power transistor device including a first current electrode 62 and a control electrode 63 on its upper surface 64 and a second current electrode 65 on its lower surface 66. The transistor device 61 is sandwiched between a die pad 67 and a redistribution layer 68 and is embedded in a dielectric layer 69.

The die pad 67 is substantially planar and may be formed by part of a lead frame and may include copper. The second current electrode 65 may be electrically coupled to an upper surface 70 of the die pad 67 by soft solder, diffusion solder or an electrically conductive adhesive. The side faces 71 and upper face surface 70 of the die pad 67 are embedded in the dielectric layer 69 and the lower surface 72 of the die pad 67 remains exposed from the dielectric layer 69. The exposed rear surface 72 of the die pad 67 may be used to assist in heat dissipation from the electronic component 60.

The redistribution layer 68 is substantially planar and is arranged on the dielectric layer 69. The redistribution layer 68 includes an electrically conductive portion 73 which is arranged on, and electrically coupled to, the gate pad 63, an electrically conductive portion 64 which is arranged on and electrically coupled to the first current electrode pad 62 and a third electrically conductive portion 75 which is electrically coupled to the die pad 67 and, therefore, to the second current electrode pad 65 by means of a stud bump 76 which extends between the upper surface 70 of the die pad 67 and the lower surface 77 of the electrically conductive portion 75 of the redistribution layer 68. Regions 78 of the redistribution layer 68 arranged between electrically conductive portions 73, 74, 75 may include a dielectric material.

The die pad 67 and the stud bump 76 provide a redistribution structure from the second surface 66 of the transistor device 61 to the redistribution layer 68 which is arranged on the opposing side of the transistor device 61.

The height of the stud bump 76 is corresponds to the height of the transistor device 61. A plurality of stud bumps 76 may be provided in place of a single stud bump 76, each of the stud bumps extending between the die pad 67 and the lower surface 77 of the electrically conductive portion 75 of the redistribution layer 68. A plurality of stud bumps may be used to decrease the resistance of the contact between the die pad 67 and the electrically conductive portion 75.

The electronic component 60 may be assembled as follows. After the second current electrode 65 is mounted on the upper surface 70 of the die pad 67, a stud bump 76 may be formed on the upper surface 70 of the die pad 67 in a region adjacent a side face 79 of the transistor device 61. The stud bump 76 may be made by forming a thermocompression bond head 80 on the upper surface 70 of the die pad 76 and cutting the bond wire to form a neck 81. In some embodiments, the stud bump 76 is formed on the upper surface 70 of the die pad 67 before the second current electrode pad is mounted on the upper surface 70 of the die pad 67.

The upper surface 70, side faces 71 of the transistor device 61 and the stud bump 76 may be embedded in the dielectric layer 79. An epoxy resin including filler particles such as silicon dioxide may be used to form the dielectric layer 69. The redistribution layer 68 may be applied to the dielectric layer 69. The redistribution layer 68 may be applied by first applying an electrically conductive material, for example by depositing a metallic layer such as a copper layer and structuring the metallic layer. A dielectric layer is then applied, for example a layer including glassfibres embedded in epoxy resin in at least regions between the portions of the structured metallic layer 65. The redistribution layer 68 and the dielectric layer 69 may include B-stage material. A heat treatment process may be carried out, optionally under pressure, to fully cure the dielectric layers 69, 78 and to improve the electrical connection between the redistribution layer 68 and the transistor device 61 and the stud bump 76.

Figure 4:
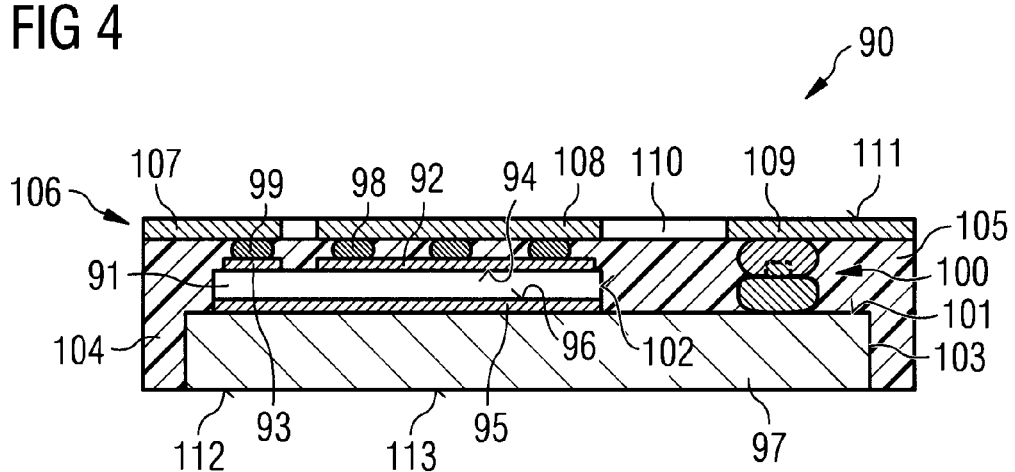
FIG. 4 illustrates an electronic component according to a fourth embodiment.

FIG. 4 illustrates an electronic component 90 according to a fourth embodiment. The electronic component 90 includes a vertical power MOSFET device 91 including a source pad 92 and a gate pad 93 on its upper surface 94 and a drain pad 95 on its lower surface 96. The drain pad 95 is mounted on, and electrically coupled to, a die pad 97. A plurality of stud bumps 98 are arranged side-by-side on the source pad 92 and a single stud bump 99 is arranged on the gate pad 93. A stack 100 of two stud bumps is arranged on the upper surface 101 of the die pad 97 adjacent to a side face 102 of the vertical power MOSFET device 91. The height of the stack 100 of stud bumps is substantially the same as the height of the vertical power MOSFET device 92 with the stud bumps 98, 99. The vertical power MOSFET device 91, the upper surface 101 and side faces 103 of the die pad 97, the stud bumps 98, 99 and the stack 100 of stud bumps are embedded in a dielectric layer 104. Portions of the stud bumps 98, 99 and upper stud bump of the stack 100 are exposed in the upper surface 105 of the dielectric layer 104.

The electronic component 90 includes a redistribution layer 106 which is arranged on the upper surface 105 of the dielectric layer 104 and on the exposed portions of the stud bumps 98, 99 and stack 100 of stud bumps. The redistribution layer 106 includes a first electrically conductive region 107 which is arranged on and electrically coupled to the stud bump 99 arranged on the gate pad 93, a second electrically conductive portion 108 which is arranged on, and electrically coupled to, each of the plurality of stud bumps 98 arranged on the source pad 92 and a third electrically conductive portion 109 which is arranged on, and electrically coupled to, the stack 100 of stud bumps. The electrically conductive portions 107, 108, 109 are separated from one another by portions of a dielectric layer 110 which is arranged on the dielectric layer 104. The outer surface 111 of the electrically conductive portions 107, 108, 109 provides contacts for the electronic component 90 which are coupled to the gate, source and drain, respectively, of the power vertical power MOSFET device 91.

In the electronic component 90 according to the fourth embodiment, the distance between the lower surface 105 of the redistribution layer 106 and the upper surface 101 of the die pad 97 is bridged by a stack 100 of two stud bumps which have the same height as the sum of the height of the stud bump 98 for stud bump 99 and height of the vertical transistor device 91. The vertical transistor device 91 may have a height of around 20 μm to 30 μm and each stud bump has a height of around 20 μm to 30 μm.

The stack 100 of stud bumps may be fabricated by forming a first stud bump on the upper surface 101 of the die pad 97 using a wire-bonding machine as described above. A second stud bump may be formed in the same way on top of the first stud bump to produce the stack 100.

In embodiments in which the transistor device has a greater height, the number of stud bumps forming the stack 100 may be increased to bridge the distance between the lower surface 105 of the redistribution layer 106 and the upper surface 101 of the die pad 97 in order to provide a three-dimensional redistribution structure from the drain pad 95 to the redistribution structure 106 on the opposing side of the transistor device 91.

The electronic component 90 may be mounted on a non-illustrated higher level circuit board by means of the outer contact surfaces 111 provided by the electrically conductive portions 107, 108, 109. The outer surfaces 111 may be mounted on the upper surface of the higher level circuit board such that the opposing surface 112 of the electronic component 90 faces upwardly. The exposed rear surface 113 of the die pad 97 may be used to assist heat dissipation from the vertical MOSFET device 91 into the environment around the electronic component 90. In the mounted position, the vertical power MOSFET device 91 may be considered to have a so-called "source-down" arrangement as the source pad 92 faces downwardly towards the high level circuit board and the drain pad 95 faces upwardly away from the higher level circuit board.

Figure 5:
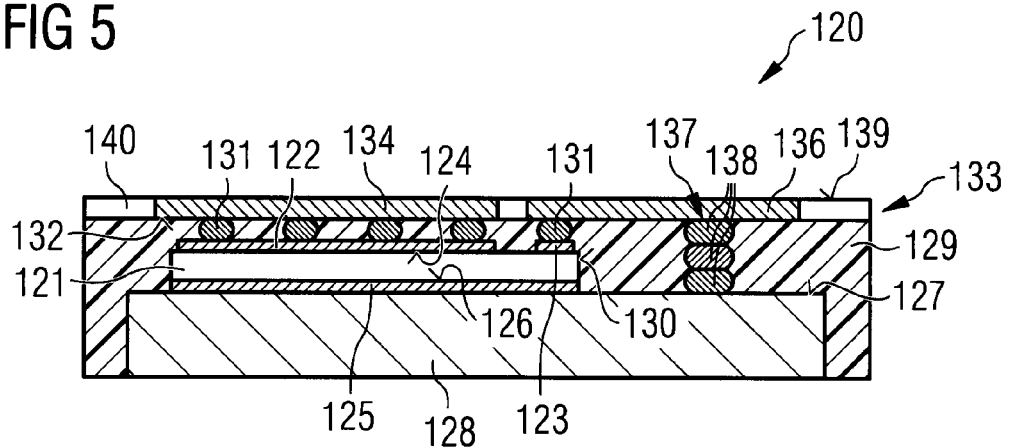
FIG. 5 illustrates an electronic component according to a fifth embodiment.

FIG. 5 illustrates an electronic component 120 according to a fifth embodiment. The electronic component 120 includes a semiconductor device in the form of a vertical transistor device 121 which includes a first current electrode pad 122 and a control electrode pad 123 on a first major surface 124 and a second current electrode pad 125 on a second major surface 126. The second major surface 126 opposes the first major surface 124. The vertical transistor device may be a vertical power MOSFET or vertical Insulated Gate Bipolar Transistor (IGBT), for example.

The second current electrode pad 125 is mounted on a first major surface 127 of a substrate 128. The substrate 128 may be formed by part of a metallic lead frame such as a copper lead frame and provides a die pad portion on which the vertical transistor device 121 may be mounted.

The vertical transistor device 121 is embedded in a dielectric layer 129 such that side faces 130, the first major surface 124 and exposed portions of the first current electrode pad 122 and the control electrode pad 123 are embedded in the dielectric layer 129.

The electronic component 120 includes a plurality of single stud bumps 131. The single stud bumps 131 are positioned on the first current electrode pad 122 and each extends between the current electrode pad 122 and the inner surface 132 of the redistribution layer 133 of the electronic component 120. The plurality of single stud bumps 131 may be distributed across the entire area of the first current electrode pad 122 such that the spacing between adjacent single stud bumps is approximately twice that of the diameter of the individual stud bumps 131. A single stud bump 131 is arranged on the control electrode pad 123 and extends from the control electrode pad 123 to the inner surface 132 of the redistribution layer 133.

The redistribution layer 133 includes electrically conductive portions and electrically insulating portions. A first electrically conductive portion 134 is arranged on, and electrically coupled to, the plurality of stud bumps 131 which are arranged on and electrically coupled to the first current electrode pad 123. A second electrically conductive portion 135 is arranged on, and electrically coupled to, the stud bump 131 which is arranged on, and electrically coupled to, the control contact pad 123. A third electrically conductive portion 136 is electrically coupled to the substrate 128 and the second current electrode pad 123 by a stack 137 of stud bumps 138 which extends from the inner surface 127 of the substrate 128 to the inner surface 132 of the third electrically conductive portion 136 of the redistribution layer 133.

The stack 137 includes three stud bumps 138 in this embodiment. However, any number of stud months may be used to provide an electrically conductive member having a suitable height such that it can extend between the substrate 128 and the inner surface 132 of the redistribution layer 133.

In the embodiment illustrated in FIG. 5, the first electrically conductive portion 134 and the third electrically conductive portion 136 are positioned towards the periphery of the lower surface 139 of the redistribution layer 132. The second electrically conductive portion 133 is positioned towards the centre. The arrangement of the electrically conductive portions of the rewiring layer 133 may be selected to provide a desired arrangement on the lower surface 139 of the electronic component 120.

The electrically conductive portions 134, 135, 136 are separated from one another by electrically insulating portions 140 of the redistribution layer 133. The outermost surface 139 of the electrically conductive portions 134, 135, 136 provide outer contact surfaces for the electronic component 120.

The electrically insulating layer 140 may be provided by a laminate such as an epoxy resin including glass fibres. The glass fibres may produce a reinforcing effect.

The dielectric layer 129 in which the vertical transistor device 121 is embedded, also surrounds the plurality of single stud bumps 131, the stud bump 132 and the stack 137 of stud bumps 138. In this embodiment, the dielectric layer 129 covers the upper surface 139 and side faces 141 of the substrate 128. The lower surface 142 of the substrate 128 remains exposed from the dielectric layer 129. The dielectric layer 129 may include an epoxy resin with filler particles such as silicon dioxide particles and may have a different composition to the composition of the electrically insulating portions 140 of the redistribution layer 133.

The dielectric layer, in which the semiconductor device is embedded, may have various arrangements with respect to the substrate. Two further examples illustrated in FIGS. 6 and 7.

Figure 6:
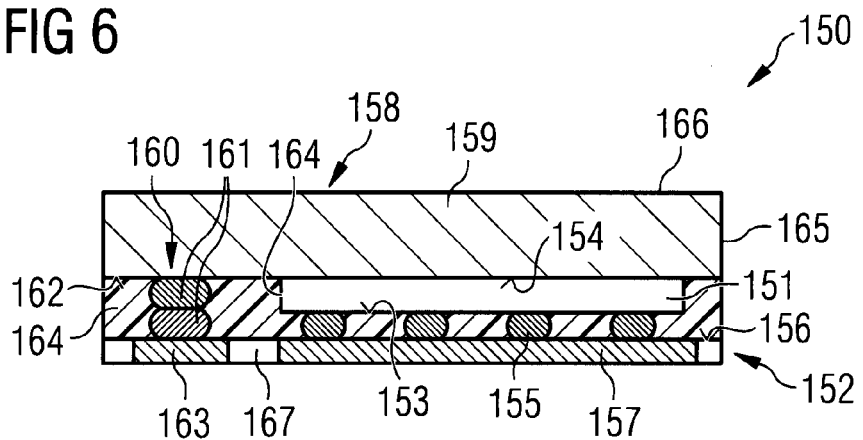
FIG. 6 illustrates the electronic component according to a sixth embodiment.

FIG. 6 illustrates an electronic component 150 which includes a semiconductor device 151 and a redistribution layer 152. The semiconductor device 151 includes contact pads on two opposing major surfaces 153, 154. The electronic component 150 includes a plurality of single stud bumps 155, each extending between the first major surface 153 of the semiconductor device 151 and the inner surface 156 of the redistribution layer 152. The stud bumps 155 electrically couple one or more contact pads of the semiconductor device 151 arranged on the first surface 153 to one or more electrically conductive portions 157 of the redistribution layer 152.

The electronic component 150 further includes a redistribution structure 158 extending between the second major surface 154 of the semiconductor device 151 which faces away from the redistribution layer 152 and the inner surface 152 of the redistribution layer 152. The redistribution structure 158 includes a substantially planar portion 159 formed by a portion of a lead frame and an electrically conductive member 160 including a stack of two stud bumps 161 which extends between the inwardly facing surface 162 of the substrate 159 and the inwardly facing surface 156 of the redistribution layer 152. The electrically conductive member 160 is arranged adjacent, and spaced apart from, a side face 164 of the semiconductor device 151. The stack of stud bumps 161 is electrically coupled to an electrically conductive portion 163 of the redistribution layer 152.

The electronic device 150 includes a dielectric layer 164 which extends between the inner surface 156 of the redistribution layer 152 and the inner surface 162 of the substrate 159 and which covers the surfaces of the semiconductor device 151, the stud bumps 152 and the electrically conductive member 160. The dielectric layer 164 is in contact with the inner surface 156 of the redistribution layer 152 and the surface 162 of the substrate 159. The side faces 165 and upwardly facing surface 166 of the substrate 159 remain exposed from the dielectric layer 164 and form part of the outer surfaces of the electronic component 150. The redistribution layer 152 may also include electrically insulating portions 167 which are arranged between the electrically conductive portions 157, 163. The electrically insulating portions 167 may have a thickness which is substantially the same or slightly less than the thickness of the electrically conductive portions 157, 163.

Figure 7:
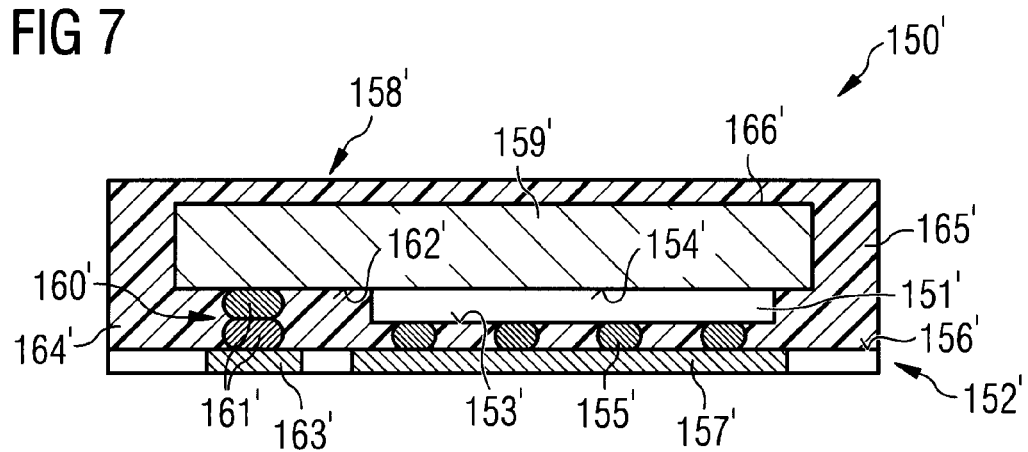
FIG. 7 illustrates an electronic component according to a seventh embodiment.

FIG. 7 illustrates an electronic component 150' according to a seventh embodiment. The electronic component 150' includes a semiconductor device 151', a redistribution layer 152' and a redistribution structure 158' including a substrate 159' and an electrically conductive member 160' including a stack of stud bumps 164' as in the electronic component 150 of the sixth embodiment.

The electronic component 150' according to the seventh embodiment differs in the arrangement of the dielectric layer 164' with respect to the substrate 159'. The dielectric layer 164' covers not only the inner surface 162' of the substrate 159' but also the side faces 165' and the outer major surface 166'.

This arrangement of the dielectric layer 164' may be used to provide electrical insulation for the redistribution structure 158' from the upper major surface 154' of the semiconductor device 151' to the redistribution layer 152' positioned on the opposing side of the electronic component 150'. In particular, the entire substrate 159' is embedded within, and electrically insulated by, the dielectric layer 164'.

As in the electronic component 150 according to the sixth embodiment, the semiconductor device 151', the stud bumps 155' and the electrically conductive member 166' are embedded in the dielectric layer 164'.

In some embodiments, the redistribution structure between the redistribution layer and the substrate arranged on the opposing side of the electronic component is provided by an electrically conductive member having a form other than a stud bump. In these embodiments, more or more stud bumps are provided, each extending and sandwiched between the semiconductor device, or a contact pad of the semiconductor device and the redistribution layer.

Figure 8:
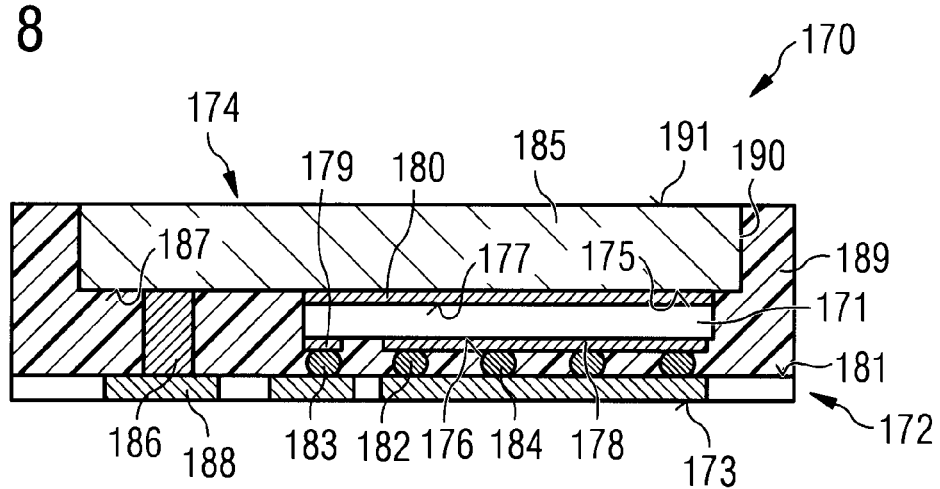
FIG. 8 illustrates an electronic component according to an eighth embodiment.

FIG. 8 illustrates an electronic component 170 according to an eighth embodiment. The electronic component 170 includes a semiconductor device 171 and a redistribution layer 172 providing outer contacts 173 of the electronic component 170. The electronic component 170 further includes a redistribution structure 174 which extends between an upwardly facing surface 175 of the semiconductor device 171 to the opposing downwardly facing side of the semiconductor device 171. The semiconductor device 171 includes contact pads on two opposing major surfaces 176, 177 of the semiconductor device 171.

In the embodiment illustrated in FIG. 8, the semiconductor device 171 is a vertical transistor device and includes a first current electrode pad 178 and a control electrode pad 179 arranged on the first major surface 176 and a second current electrode pad 180 arranged on the second major surface 172. The first current electrode pad 178 and the control electrode pad 179 are spaced at a distance from an inner surface 181 of the redistribution layer 172 by a plurality of single stud bumps 182. In this embodiment, a single stud bump 183 extends between the control electrode pad 179 and the inner surface 181 of the redistribution layer 172 and a plurality of single stud bumps 184 extends between the first current electrode pad 178 and the inner surface 181 of the redistribution layer 172.

The redistribution structure 174 includes a substantially planar electrically conductive portion 185 which lies substantially parallel to and above the redistribution layer 172. The electrically conductive portion 185 is electrically coupled to the redistribution layer 172 by means of an electrically conductive pillar 186 which extends from the lower surface 187 of the electrically conductive portion 185 to the inner surface 181 of the redistribution layer 172 and, in particular, to an electrically conductive portion 188 of the redistribution layer 172. In this embodiment, the redistribution structure from the upper side of the semiconductor device 171 to the redistribution layer 172 arranged on the opposing side of the semiconductor device 171 does not include a stud bump. Stud bumps are arranged only between the first major surface of the semiconductor device 171 and the redistribution layer 172.

The electrically conductive pillar 186 has a lateral area which remains substantially the same throughout the height of the pillar 186. The electrically conductive pillar 186 is solid and electrically conductive throughout its volume. In some embodiments, the pillar 186 includes a cylinder of a metal such as copper.

The electrically conductive pillar 186 may be formed on the surface 187 of the substrate 185 by selective deposition of a metal, for example using a mask. The electrically conductive pillar 186 may be formed by removing portions of the substrate to produce an electrically conductive pillar 186 protruding from a remaining substrate portion 185.

The semiconductor device 171 and the electrically conductive pillar 186 are embedded in a dielectric layer 189 which extends between the lower surface 187 of the electrically conductive portion 185 and the inner surface of the redistribution layer 172. The side faces 190 of the electrically conductive portion 185 are also embedded in the dielectric layer 189. The rear surface 191 of the electrically conductive portion 185 remains uncovered by the dielectric layer 189. However, the dielectric layer 189 is not limited to this arrangement and may have other arrangements with respect to the substrate. For example, the side faces 190 and the rear surface 191 may be embedded in or exposed from the dielectric layer 189.

The electronic component 190 may be formed using the following method. A semiconductor device 171 may be applied to the first major surface 187 of a substrate 185. In particular, the second current electrode pad 180 may be mounted on, and electrically coupled to, the surface 187 of the substrate 185. The second current electrode pad 175 may be mounted on the surface 187 using soft solder, diffusion solder or electrically conductive adhesive. The electrically conductive pillar 191 may be formed on the surface 187 of the substrate 185 adjacent to the side face of the semiconductor device 171. In some embodiments, the electrically conductive pillar 191 is formed first and then the semiconductor device 171 attached to the substrate 185.

The electrically conductive pillar 191 may be formed by selective deposition of a metal such as copper. Selective deposition of the metal may be formed using one or more of sputtering, evaporation, electroplating and electroless plating. The combination of methods may be used. For example, a seed layer may be deposited using physical vapour deposition technique, for example sputtering, on the surface of the substrate 187 and an electrically conductive pillar built up on the seed layer using a electroplating deposition technique. The position of the seed layer and the electrically conductive pillar 191 may differ. The height of the electrically conductive pillar 191 may correspond generally to the height of the semiconductor device 171.

Stud bumps 182, 184, 192 may then be formed on the control electrode pad 179, the first current electrode pad 178 and pillar 191, for example using a wire bonding machine.

The dielectric layer 189 may then be applied such that it surrounds and embeds the semiconductor device 171, at least the first major surface 187 of the substrate 185, the electrically conductive pillar 191 and the stud bumps 182, 184, 192. The dielectric layer may include epoxy resin with filler particles, such as silicon dioxide particles. The dielectric layer 189 may have an upper surface which completely covers the stud bumps 182, 184, 192 or may leave at least a portion of the neck of the stud bumps 182, 184, 192 exposed from the dielectric material. The grinding process may be carried out to smooth the upper surface of the dielectric layer 189 and to remove at least a portion of the neck of the stud bumps 182, 184, 192. The grinding process may also be used to produce a planar surface. The use of the stud bump 192 arranged on the electrically conductive pillar 191 may assist in producing a clean electrically conductive surface for the electrically conductive member 186 for electrically coupling the electrically conductive pillar 191 to the redistribution layer 172.

The redistribution layer 172 may be applied to the ground surface. The redistribution layer 172 may be produced by firstly depositing an electrically conductive layer which may form the outer contacts of the electronic component 194 or part of the first layer of a multilayer redistribution structure.

The electrically conductive layer may be deposited as a closed layer which is then structured to provide separate electrically conductive portions. Alternatively, the electrically conductive layer may be deposited selectively. A dielectric layer, for example including an epoxy resin with glass fibres, may be applied to at least regions between the electrically conductive portions.

Figure 9:
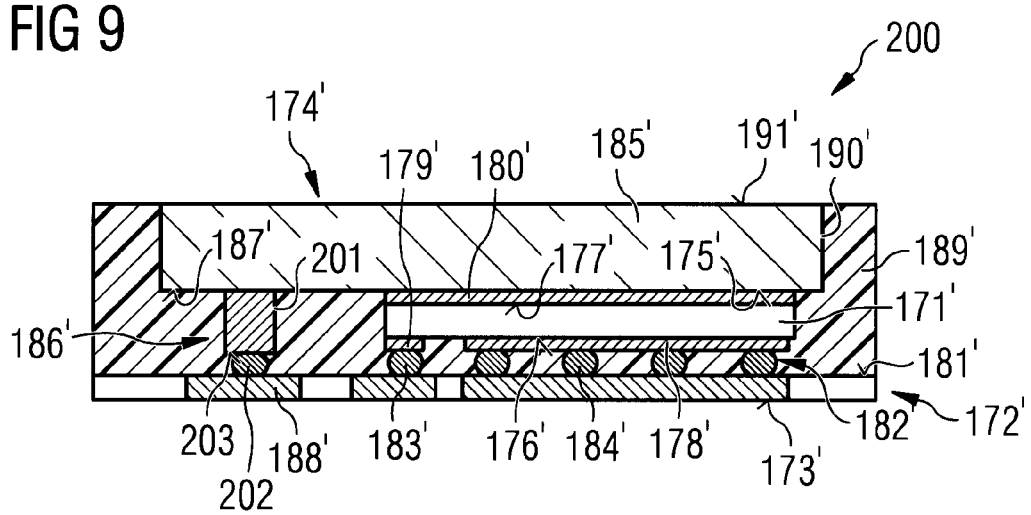
FIG. 9 illustrates the electronic component according to a ninth embodiment.

FIG. 9 illustrates an electronic component 200 according to a ninth embodiment which includes a semiconductor device 171', a redistribution layer 172' and a redistribution structure 174' as in the electronic component 170' according to the eighth embodiment.

The electronic component 200 according to the ninth embodiment differs from the electronic component 170 according to the eighth embodiment in the arrangement of the electrically conductive member 186' which extends between the lower surface 187' of the substrate 185' and the inner surface 181' of the redistribution layer 172'. In the electronic component 200, the electrically conductive member 186' includes an electrically conductive pillar portion 201 and a stud bump 202. The electrically conductive pillar portion 201 extends from the lower surface 187' of the substrate 185' and the stud bump 202 extends between the electrically conductive pillar 201 and the inner surface 181' of an electrically conductive portion 188' of the redistribution layer 172'.

The electrically conductive member 186' may be formed by first producing an electrically conductive pillar 201 on the surface 187' of the substrate 185' and then forming a stud bump 192' on the upper surface 203 of the electrically conductive pillar 201. The stud bump 202 may be formed on the surface 203 of the pillar 202 using a wire bonding machine by, for example, forming a bonding head on the surface 203 and cutting a bond wire close to the bond head. A thermocompression bonding technique may be used. In this case, the head may be termed a thermocompression head.

The height of the electrically conductive pillar 201 may be substantially the same as the height of the semiconductor device 171'. This may be useful in embodiments in which single stud bump is also applied to the surface 176' of the semiconductor device 171' which faces towards the inner surface 181 of the redistribution layer 172'.

The combination of an electrically conductive pillar 201 and stud bump 202 may be useful in embodiments in which a grinding process is used before the redistribution layer 172' is applied. The grinding process may be used to planarize the surface of the dielectric layer 189' and stud bumps 182' 203 and/or to expose a portion of the stud bumps 182' 203 in order to electrically couple the stud bumps 182' 203 to electrically conductive portions of the redistribution layer 172'.

The electronic components according to the embodiments described herein, may have a redistribution layer which is a single layer or which includes two or more sublayers to provide an electrically conductive multilayer three-dimensional redistribution structure within the redistribution layer.

Figure 10:
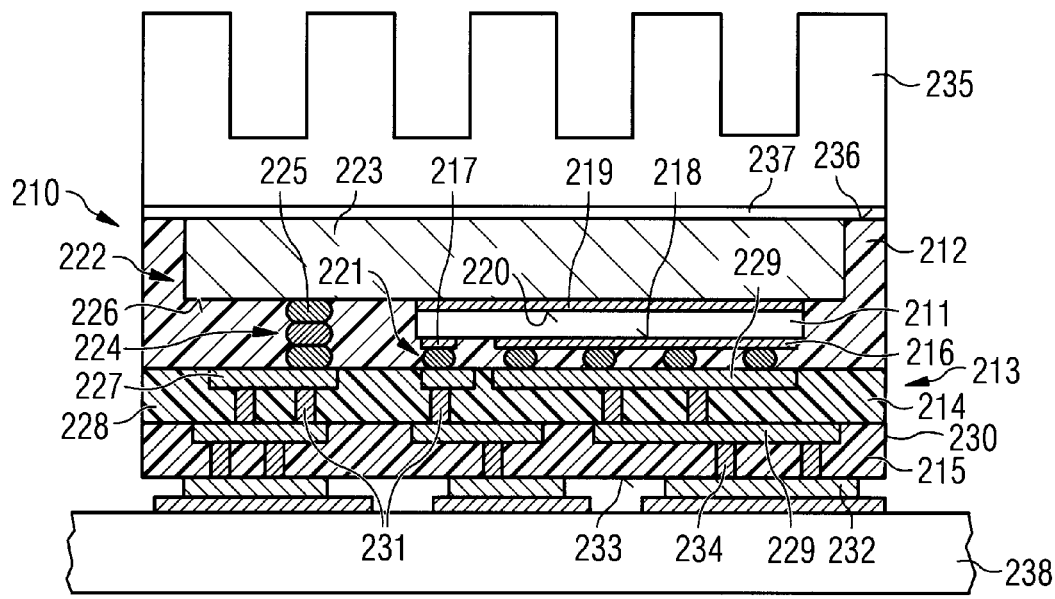
FIG. 10 illustrates an electronic component according to a tenth embodiment.

FIG. 10 illustrates an electronic component 210 according to a tenth embodiment. The electronic component 210 includes a semiconductor device 211 embedded in a dielectric layer 212 and electrically coupled to a rewiring layer 213. In the electronic component 210 according to the tenth embodiment, the redistribution layer 213 is a multilayer redistribution structure and includes two sublayers 214, 215. However, the redistribution layer 213 is not limited to two sublayers and may include 3, 4 or more sublayers.

A multilayer redistribution layer may be used to provide an electronic component in which the outer contact surfaces have an arrangement and/or lateral distribution which is different from the arrangement in lateral distribution of the contact pads of the semiconductor device. For example, the electronic component may include two outer contacts which are coupled to a single contact pad. In some embodiments, the semiconductor device includes a transistor device and two outer contacts are coupled to a first current electrode, two outer contacts are coupled to a second current electrode and two outer contacts are coupled to the control electrode of provided as.

In the embodiment illustrated in FIG. 10, the semiconductor device 211 includes a vertical power transistor device including a first current electrode pad 216 and a control electrode pad 217 on a first major surface 218 which faces towards the redistribution layer 213 and a second current electrode pad 219 which is arranged on the second surface 220 which faces away from the redistribution layer 213. The electronic component 210 further includes a plurality of single stud bumps 221 each of which extends between the first current electrode pad 216 and the control electrode pad 217 arranged on the first major surface 218 and the interface between the dielectric layer 212 and the redistribution layer 213.

The electronic component 210 further includes a redistribution structure 222 arranged within the dielectric layer 212 which includes a substantially planar portion 223 which is arranged on, and electrically coupled to, the second current electrode pad 219 and which is electrically coupled to the redistribution layer 230 by a vertical electrically conductive member 224 which includes a stack of stud bumps 225.

In this particular embodiment, the electrically conductive member 224 includes a stack of three stud bumps and extends between the lower surface 226 of the substantially planar portion 223 and the interface between the dielectric layer 212 and the redistribution layer 214. However, one, two or more than three stud bumps may be used to provide the electrically conductive member 224 depending on the distance between the substantially planar portion 223 and the redistribution layer 213. In some embodiments, the stud bumps may be replaced by an electrically conductive pillar or an electrically conductive pillar and a single stud bump.

A heat sink 235 or heat dissipating component may be arranged on the upper surface 236 of the electronic component 210 and, in particular, on the substantially planar portion 223. The heat sink 235 may be electrically insulated from the substantially planar portion 223 and the redistribution structure 222 by an electrically insulating layer which is arranged between the upper surface 236 of the electronic component and the heat sink 235. The heat sink 235 may include a plurality of fins or some other structure to increase the surface area and improve heat dissipation from the heat sink. The heat sink 235 may include a metal such as copper.

The first sublayer 214 of the redistribution layer 213 includes a plurality of conductive portions 227 which is arranged on, and electrically coupled to, the stud bumps 221 on the first current electrode, the control electrode and the stack of stud bumps which is coupled to the drain electrode of the semiconductor device 211. The electrically conductive portions 212 are substantially planar and embedded in a dielectric layer 228.

Similarly, the second sublayer 215 of the redistribution layer 213 is arranged on the first sublayer 214 and includes a plurality of substantially planar conductive portions 229 embedded in a dielectric layer 230. The conductive portions 227 of the first sublayer 214 are electrically coupled to the conductive portions 229 of the second sublayer 215 by conductive vias 231 which extend through the thickness of the dielectric layer 228 of the first sublayer 214. The redistribution layer 213 further includes outer contacts 232 which are arranged on the outer surface 233 of the second sublayer 215. The outer contact pads 232 are electrically coupled to the conductive portions 229 of the second sublayer 215 by conductive vias 234 which extend through the thickness of the dielectric 213 of the second sublayer 215. An outer contact pad is, therefore, electrically coupled to one of the first current electrode pad, control electrode pad or second current electrode pad of the semiconductor device 211.

The electronic component 210 may be mounted on a higher level circuit board 238 such as a printed circuit board. In particular, the outer contact pads 232 may be mounted on electrically conductive pads or traces on the higher level circuit board 238 to electrically couple the electronic component 210 to further devices and/or circuitry included in the higher level circuit board 238.

The redistribution layer 213 may be fabricated by depositing a conductive layer which is structured to produce the first conductive portions 227, depositing a dielectric layer 228, forming a plurality of through holes to exposed portions of the conductive portions 227 and depositing conductive material which at least lines the walls of the through holes to produce the conductive vias 232. Subsequent sublayers of the redistribution structure 213 may be built up in a similar manner.

The dielectric material forming the dielectric layers 228, 230 of the redistribution structure 213 may include a glassfibre reinforced epoxy resin and may include a B-stageable epoxy resin such that after the deposition of the dielectric layers 228, 230 the dielectric is cured such that the layers in the B-stage. The B-stage is a state in which the epoxy resin is partially cured. After the production of the entire redistribution 213, a final curing process may be carried out to fully cure the dielectric layers 228, 213 of the redistribution structure 213 and, in some embodiments, also fully cure the dielectric layer 212 in which the semiconductor device 211 is embedded.

The electronic component according to the embodiments described herein may include different types of semiconductor device. The semiconductor device may be a high-voltage device or a low-voltage device. The semiconductor device is not limited to a silicon-based device such as a silicon-based MOSFET or silicon-based Insulated Gate Bipolar Transistor. In some embodiments, the semiconductor device may include a gallium nitride-based transistor, such as a gallium nitride-based High Electron Mobility Transistor (HEMT).

A gallium nitride-based transistor may include a source pad, the drain pad and a gate pad arranged on a first major surface of the semiconductor device and a further contact pad arranged on the second opposing major surface of the semiconductor device. The further contact pad may be electrically coupled to the source electrode. Such an arrangement may be considered to be a quasi-vertical device.

The further contact pad arranged on the second major surface may be electrically coupled to the source pad on the opposing first major surface by a conductive via, for example, which extend through the thickness of the device. In some embodiments, the source pad on the first major surface may be omitted and the source electrode is electrically coupled, for example by a conductive via, to the contact pad arranged on the second major surface of the semiconductor device.

The electronic component is not limited to including a single semiconductor device but may include two or more semiconductor devices embedded in a common dielectric layer. The two or more semiconductor devices may be electrically coupled such that the electronic component provides a particular circuit.

Figure 11:
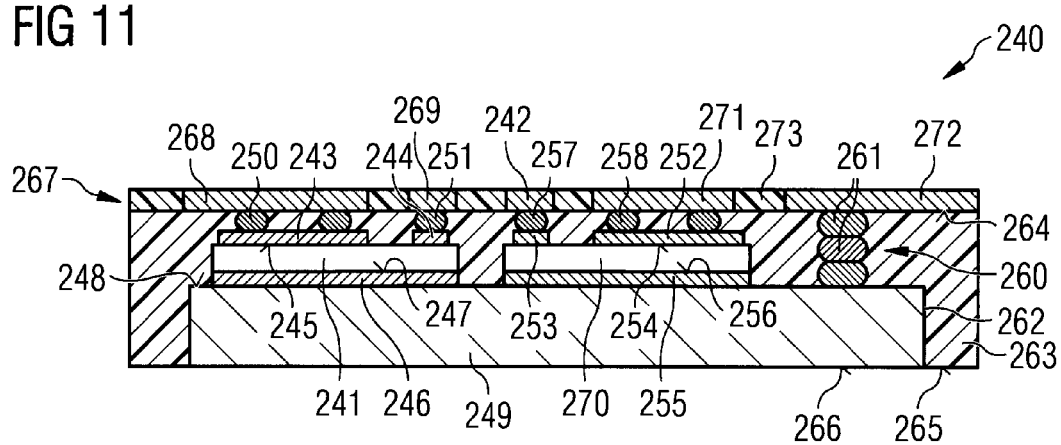
FIG. 11 illustrates an electronic component according to an eleventh embodiment.

FIG. 11 illustrates an electronic component 240 according to an eleventh embodiment which includes two semiconductor devices in the form of an n-type MOSFET 241 and a p-type MOSFET 242 which are electrically coupled to provide a half bridge circuit.

The n-type MOSFET device 241 includes a source pad 243 and a gate pad 244 on a first major surface 245 and a drain pad 246 on a second major surface 247 which opposes the first major surface 245. The drain pad 246 is mounted on, and electrically coupled to, a first major surface 248 of a substrate 249 by, for example, soft solder. One or more stud bumps 250 are arranged on the source pad 243 and a single stud bump 251 is arranged on the gate pad 244.

The p-type MOSFET device 242 includes a source pad 252 and gate pad 253 arranged on a first major surface 254 and a drain pad 255 arranged on the second major surface 256 which opposes the first major surface 254. A stud bump 257 is arranged on the gate pad 253 and one or more stud single sub bumps 258 are arranged on the source pad 252. The drain pad 255 is mounted on, and electrically coupled to, the first major surface 248 of the substrate 249 by, for example, soft solder. The drain pad drain of the n-type MOSFET device 241 is coupled to the drain of the p-type MOSFET device 244 by means of the substrate 249.

The electronic component 240 further includes an electrically conductive member 260 including a stack of stud bumps 261. The electrically conductive member 260 is arranged on the first major surface 248 of the substrate 249 adjacent the semiconductor devices 241, 242. The semiconductor devices 241, 242, the electrically conductive member 260, the first major surface 258 and side faces 262 of the substrate 249 are embedded in a common dielectric layer 263. Portions of the stud bumps 250, 251, 257, 258 and a portion of the upper stud bump of the stack 261 lie exposed in a first major surface 264 of the dielectric layer 263. The opposing second major surface 265 of the dielectric layer 263 is substantially coplanar with the second major surface 266 of the substrate 249.

The electronic component 240 includes a redistribution layer 267 which is arranged on the first major surface 264 of the dielectric layer 263 and which is electrically coupled to the n-type MOSFET device 241, the p-type MOSFET device 242 and to the electrically conductive member 260. The redistribution layer 267 includes a first conductive portion 268 which is electrically coupled to the stud bumps 250 and the source pad 243 of the n-type MOSFET device 241, a second electrically conductive portion 269 which is electrically coupled to the stud bump 251 and the gate pad 244 of the n-type MOSFET device 241, a third electrically conductive portion 270 which is electrically coupled to the stud bump 257 and the gate pad 253 of the n-type MOSFET device 242, a fourth electrically conductive portion 271 which is electrically coupled to the stud bump 258 and the source pad 252 of the p-type MOSFET device 242 and a fifth conductive portion 272 which is electrically coupled to the electrically conductive member 260 and, therefore, to the substrate 249, the drain pad 246 of the n-type MOSFET device 241 and the drain pad 255 of the p-type MOSFET device 242. The electrically conductive portions 268, 269, 270, 272, 272 may be embedded in a dielectric layer 273 of the redistribution layer 267. An outer surface of the conductive portions 268, 269, 270, 272, 272 may provide outer contacts surface of the electronic component 240.

In other non-illustrated embodiments, the redistribution layer 267 includes a multilayer redistribution structure provided by two or more sublayers each including conductive portions and a dielectric layer, whereby conductive portions of adjacent sublayers may be electrically coupled by conductive vias.

The redistribution layer of the electronic component of one or more of the embodiments described herein, may include outer contracts providing a desired footprint or package outline, which may conform to a JEDEC (JEDEC Solid State Technology Association formerly Joint Electron Device Engineering Council) standard, for example a JEDEC standard for a surface mountable component such as a Super SO8 package outline, a QFN (Quad Flat No-lead) package, or a Blade package outline.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
a dielectric layer;
a semiconductor device embedded in the dielectric layer, wherein the semiconductor device comprises a first surface comprising a first contact pad and a second surface comprising a second contact pad;
an electrically conductive substrate; and
a redistribution layer comprising a first surface, a second surface providing at least one outer contact and a first electrically conductive member,
wherein the second contact pad is mounted on the electrically conductive substrate and the first electrically conductive member comprises at least one stud bump and extends between the electrically conductive substrate and the first surface of the redistribution layer, wherein the electronic component further comprises at least one second electrically conductive member comprising a stud bump, the second electrically conductive member extending between the first contact pad and the first surface of the redistribution layer.

2. The electronic component according to claim 1, wherein the stud bump is free of solder.

3. The electronic component according to claim 1, wherein the electrically conductive member comprises a plurality of stud bumps arranged in a stack.

4. The electronic component according to claim 1, wherein the electrically conductive member comprises a conductive pillar and the stud bump is arranged on the conductive pillar.

5. The electronic component according to claim 1, further comprising a plurality of single stud bumps arranged on the first contact pad, each single stud bump extending between the first contact pad and the first surface of the redistribution layer.

6. The electronic component according to claim 1, wherein the first contact pad and side faces of the semiconductor device are embedded in the dielectric layer.

7. The electronic component according to claim 1, wherein the first electrically conductive member is embedded in the dielectric layer.

8. The electronic component according to claim 1, wherein side faces of the substrate are embedded in the dielectric layer.

9. The electronic component according to claim 1, wherein a rear face of the substrate is exposed from the dielectric layer.

10. The electronic component according to claim 1, wherein a rear face of the substrate is embedded in the dielectric layer.

11. The electronic component according to claim 1, wherein the redistribution layer comprises a substantially planar sublayer comprising a substantially planar electrically conductive redistribution structure surrounded by a substantially planar dielectric layer.

12. The electronic component according to claim 1, wherein the redistribution layer comprises at least two substantially planar sublayers, each sublayer comprising a substantially planar electrically conductive redistribution structure surrounded by a substantially planar dielectric layer, adjacent sublayers being electrically coupled by at least one conductive via.

13. The electronic component according to claim 1, wherein the semiconductor device comprises a transistor device.

14. The electronic component according to claim 1, wherein the semiconductor device comprises a third contact pad arranged on the first surface and a third electrically conductive member comprising a stud bump that extends between the third contact pad and the first surface of the redistribution layer.

15. The electronic component according to claim 1, further comprising a further semiconductor device embedded in the dielectric layer.

16. The electronic component according to claim 15, wherein the semiconductor device and the further semiconductor device each comprise a transistor device.

17. The electronic component according to claim 16, wherein the transistor devices are coupled in a half-bridge configuration.

18. An electronic component, comprising:
a dielectric layer;
a semiconductor device embedded in the dielectric layer, wherein the semiconductor device comprises a first surface comprising at least one first contact pad and a second surface comprising at least one second contact pad;
a redistribution layer comprising a first surface and a second surface providing at least one outer contact;
an electrically conductive substrate; and
a first electrically conductive member extending between the electrically conductive substrate and the first surface of the redistribution layer,
wherein the at least second contact pad is mounted on the electrically conductive substrate and at least one stud bump extends between the at least first contact pad and the first surface of the redistribution layer.

19. The electronic component according to claim 18, wherein the first electrically conductive member is one of an electrically conductive pillar, a contact clip, an electrically conductive foil and a bent portion of the substrate.

20. An electronic component, comprising:
a dielectric layer;
a semiconductor device embedded in the dielectric layer, wherein the semiconductor device comprises a first surface comprising a first contact pad and a second surface comprising a second contact pad;
an electrically conductive substrate;
a redistribution layer comprising a first surface, a second surface providing at least one outer contact and a first electrically conductive member; and
a plurality of single stud bumps arranged on the first contact pad, each single stud bump extending between the first contact pad and the first surface of the redistribution layer,
wherein the second contact pad is mounted on the electrically conductive substrate and the first electrically conductive member comprises at least one stud bump and extends between the electrically conductive substrate and the first surface of the redistribution layer.

21. An electronic component, comprising:
a dielectric layer;
a semiconductor device embedded in the dielectric layer, wherein the semiconductor device comprises a first surface comprising a first contact pad and a second surface comprising a second contact pad;
an electrically conductive substrate; and
a redistribution layer comprising a first surface, a second surface providing at least one outer contact and a first electrically conductive member,
wherein the second contact pad is mounted on the electrically conductive substrate and the first electrically conductive member comprises at least one stud bump and extends between the electrically conductive substrate and the first surface of the redistribution layer,
wherein the first contact pad and side faces of the semiconductor device are embedded in the dielectric layer.

22. An electronic component, comprising:
a dielectric layer;
a semiconductor device embedded in the dielectric layer, wherein the semiconductor device comprises a first surface comprising a first contact pad and a second surface comprising a second contact pad;
an electrically conductive substrate; and
a redistribution layer comprising a first surface, a second surface providing at least one outer contact and a first electrically conductive member, wherein the second contact pad is mounted on the electrically conductive substrate and the first electrically conductive member comprises at least one stud bump and extends between the electrically conductive substrate and the first surface of the redistribution layer, wherein side faces of the substrate are embedded in the dielectric layer.

23. An electronic component, comprising:

a dielectric layer;

a semiconductor device embedded in the dielectric layer, wherein the semiconductor device comprises a first surface comprising a first contact pad and a second surface comprising a second contact pad;

an electrically conductive substrate; and a redistribution layer comprising a first surface, a second surface providing at least one outer contact and a first electrically conductive member, wherein the second contact pad is mounted on the electrically conductive substrate and the first electrically conductive member comprises at least one stud bump and extends between the electrically conductive substrate and the first surface of the redistribution layer, wherein a rear face of the substrate is embedded in the dielectric layer.

24. An electronic component, comprising:

a dielectric layer;

a semiconductor device embedded in the dielectric layer, wherein the semiconductor device comprises a first surface comprising a first contact pad and a second surface comprising a second contact pad;

an electrically conductive substrate; and a redistribution layer comprising a first surface, a second surface providing at least one outer contact and a first electrically conductive member, wherein the second contact pad is mounted on the electrically conductive substrate and the first electrically conductive member comprises at least one stud bump and extends between the electrically conductive substrate and the first surface of the redistribution layer, wherein the redistribution layer comprises a substantially planar sublayer comprising a substantially planar electrically conductive redistribution structure surrounded by a substantially planar dielectric layer.

25. An electronic component, comprising:

a dielectric layer;

a semiconductor device embedded in the dielectric layer, wherein the semiconductor device comprises a first surface comprising a first contact pad and a second surface comprising a second contact pad;

an electrically conductive substrate; and a redistribution layer comprising a first surface, a second surface providing at least one outer contact and a first electrically conductive member, wherein the second contact pad is mounted on the electrically conductive substrate and the first electrically conductive member comprises at least one stud bump and extends between the electrically conductive substrate and the first surface of the redistribution layer, wherein the redistribution layer comprises at least two substantially planar sublayers, each sublayer comprising a substantially planar electrically conductive redistribution structure surrounded by a substantially planar dielectric layer, adjacent sublayers being electrically coupled by at least one conductive via.

26. An electronic component, comprising:

a dielectric layer;

a semiconductor device embedded in the dielectric layer, wherein the semiconductor device comprises a first surface comprising a first contact pad and a second surface comprising a second contact pad;

an electrically conductive substrate; and a redistribution layer comprising a first surface, a second surface providing at least one outer, contact and a first electrically conductive member, wherein the second contact pad is mounted on the electrically conductive substrate and the first electrically conductive member comprises at least one stud bump and extends between the electrically conductive substrate and the first surface of the redistribution layer, wherein the semiconductor device comprises a third contact pad arranged on the first surface and a third electrically conductive member comprising a stud bump that extends between the third contact pad and the first surface of the redistribution layer.

* * * * *